June 28, 1960 E. N. BELLAND 2,943,266
TRANSISTOR AMPLIFIER CIRCUIT
Filed Oct. 22, 1956
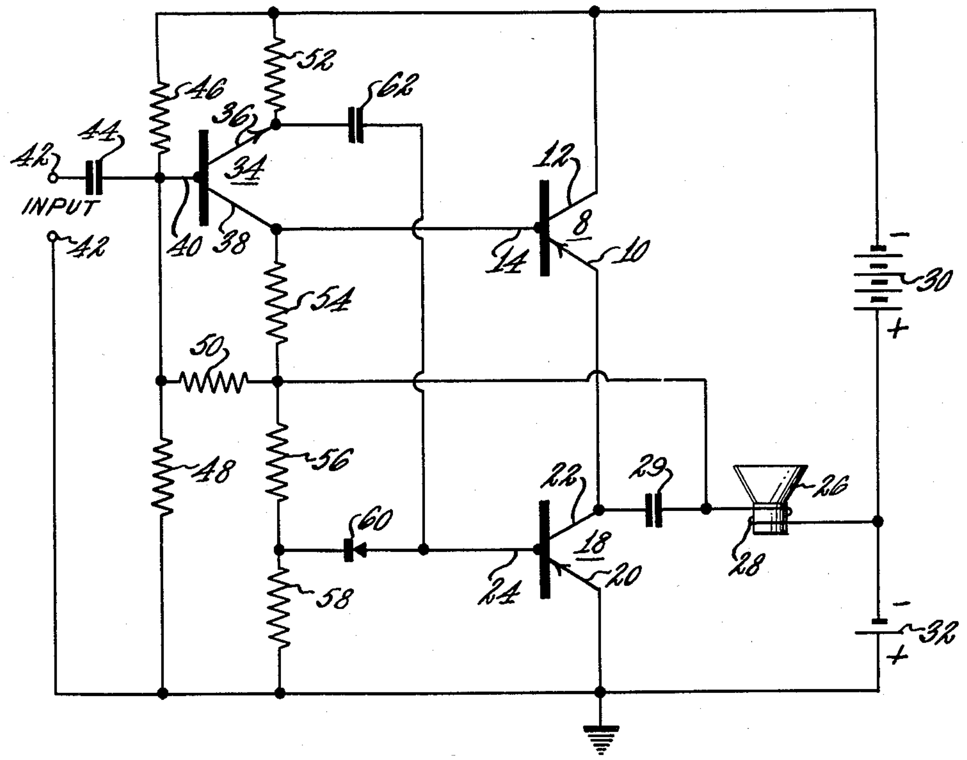
INVENTOR.
ERLING N. BELLAND
BY Dean W. Chace
ATTORNEY 2,943,266
Patented June 28, 1960

2,943,266

TRANSISTOR AMPLIFIER CIRCUIT

Erling N. Belland, New York, N.Y., assignor to Radio Corporation of America, a corporation of Delaware Filed Oct. 22, 1956, Ser. No. 617,531

3 Claims. (Cl. 330—14)

This invention relates in general to signal amplifier circuits and in particular to audio frequency class B push-pull signal amplifier circuits utilizing transistors.

The advantages of audio frequency amplifiers of the class B push-pull type include efficient operation and relatively low power supply drain. Generally, however, class B push-pull circuits require input and output transformers which are relatively costly and subject to other disadvantages. To eliminate the input and output transformers for such circuits, pairs of transistors of opposite conductivity types may be used. This latter type circuit, which is commonly referred to as a complementary symmetry class B push-pull circuit, has many desirable features. One disadvantage of such a circuit, however, is that the operating characteristics of the opposite conductivity transistors used must be very nearly symmetrical, which requires careful matching of the transistors.

Transformerless class B push-pull circuits have also been devised using transistors of the same conductivity type. In these circuits, a pair of transistors of the same conductivity type are connected in parallel for supplying signal currents to a load. A circuit of this type may use a driving transformer or some other type of phase-splitting driving device. Generally speaking, however, it is difficult to maintain circuit balance in such circuits. That is to say, the circuit gain on opposite half cycles of an applied signal may not be equal so that the signal current flow to the load may be different for each half cycle of applied signal.

It is accordingly an object of this invention to provide improved means for driving a class B push-pull amplifier circuit utilizing transistors of the same conductivity type.

It is another object of the present invention to provide an improved audio frequency amplifier circuit wherein balanced circuit operation of a class B push-pull output stage utilizing transistors of the same conductivity type is maintained without the need of a driving transformer.

In accordance with the invention, a class B push-pull output stage utilizing transistors of the same conductivity type is driven by a driver stage comprising a single transistor which is of an opposite conductivity type to the output transistors. One of the output transistors operates as a common collector amplifier and is driven by the driver transistor operating as a common emitter amplifier. The other output transistor operates as a common emitter amplifier and is driven by the driver transistor operating as a common collector amplifier. By this type circuit, the circuit gain on alternate half-cycles of an applied signal is approximately the same, thus maintaining circuit balance without the need of transformers.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which the single figure is a schematic circuit diagram of an audio frequency amplifier circuit embodying the invention.

Referring now to the drawing, the power output stage of the amplifier includes a pair of transistors 8 and 18 which are of the same conductivity type and which include emitter 10, 20, collector 12, 22 and base 14, 24, electrodes, respectively. The transistors 8 and 18 may be considered to be of the P-N-P junction type and are connected to supply signal currents to a utilization device on alternate half-cycles of an applied input signal. The utilization device has been illustrated as a loudspeaker 26 of the conventional moving coil type. The coil 28 of the loudspeaker 26 is coupled through a capacitor 29 to the collector electrode 22 of the transistor 18 and to the emitter 10 of the other transistor 8.

The emitter-collector circuits of the output transistors are connected in series for direct-current and with a direct-current supply source. The supply source comprises a battery 30, the negative terminal of which is connected directly with the collector 12 of the transistor 8. The positive terminal of the battery 30 is connected to the negative terminal of an auxiliary battery 32, the positive terminal of which is grounded. The negative terminal of the auxiliary battery 32 is connected to the low signal voltage end of the loudspeaker coil 28. To complete the series direct-current circuit, the collector 22 of the transistor 18 is directly connected with the emitter 10 of the transistor 8, while the emitter 20 of the transistor 18 is connected directly to a point of reference potential or ground.

With the connections shown and described, the transistors 8 and 18 will operate as a class B push-pull amplifier. The transistor 8 is of the so-called common collector configuration, while the transistor 18 is connected for common emitter operation. This general type of power output circuit is well known.

To drive the output transistors and provide substantially balanced circuit operation, a driver transistor 34 is selected, in accordance with the invention, to be of an opposite conductivity type to the output transistors 8 and 18. Thus, in the present example, the transistor 34 may be considered to be of the N-P-N junction type. The transistor 34 includes an emitter 36, a collector 38 and a base 40. The transistor 34 is connected in the circuit, in accordance with the invention, to operate as a common emitter amplifier to drive the output transistor 8 on one half cycle of an applied signal, and as a common collector amplifier to drive the output transistor 18 on the opposite half cycle of an applied signal.

Input signals are applied to the base electrode 40 of the driver transistor 34 from a pair of input terminals 42, one of which is grounded and the other of which is connected to the base 40 through a coupling capacitor 44. The driver transistor 34 is biased for class A signal amplifier operation. To establish a fixed base potential for the driver transistor 34 a voltage divider comprising a pair of resistors 46 and 48 is provided. The resistor 46 is connected between the base 40 and the negative terminal of the supply battery 30, while the resistor 48 is connected between the base 40 and ground. The base 40 is also connected through a resistor 50 and the voice coil 28 of the loudspeaker 26 to the negative terminal of the auxiliary supply battery 32. To apply biasing potentials to the emitter 36 of the driver transistor 34, the emitter 36 is connected through a resistor 52 to the negative terminal of the battery 30. To supply collector biasing potentials for the collector 38 of the driver transistor and base bias for the output transistors 14 and 24, the collector 38 of the driver transistor 34 is connected through three relatively low value resistors 54, 56, and 58 to ground. The junction of the resistors 54 and 56 is connected to the negative terminal of the battery 32 through the loudspeaker coil 28. The collector 38 of the driver transistor 34 is directly connected to the base 14 of the output transistor 8. Since the base current of the transistor 8 is small compared to the collector current of the driver transistor 34, the base potential of the transistor 34 will be equal to the voltage of the battery plus the voltage drop across the resistor 54. Since the resistance of the resistor 54 is relatively small, the base 14 of the transistor 8 is connected to a relatively low impedance direct-current point. The connection from the junction of the resistors 54 and 56 through the voice coil 28 to the battery 32 raises the dynamic impedance at the collector 38 of the driver transistor 34.

The resistors 56 and 58 comprise a voltage divider for establishing the base potential of the output transistor 18. The base 24 of this transistor is clamped to the potential at the junction of the two voltage dividing resistors 56 and 58 by connecting the base 24 through a diode 60 to this junction point. The diode 60 serves several important functions as will be discussed hereinafter. By fixing the base voltage of the transistor 18, its collector current is also determined. Since the collector 22 of the transistor 18 is connected directly with the emitter 10 of the transistor 8, the same current must flow in both of these electrodes and the quiescent collector current of the transistor 8 is, therefore, also determined. To provide a signal conveying path between the emitter 36 of the driver transistor 34 and the base electrode 24 of the output transistor 18, and to complete the circuit, a coupling capacitor 62 is connected from the emitter 36 to the base 24.

In operation, the driver transistor 34 is biased for class A operation. Accordingly, on positive half-cycles of an applied input signal the driver transistor 34 will conduct more heavily. Thus, the voltage on the emitter 36 will become less negative and the voltage on the collector 38 will become more negative. Since the collector 38 is directly coupled with the base 14 of the output transistor 8 (which is biased class B), the transistor 8 will conduct and provide signal current flow through the voice coil 28 of the loudspeaker 26. On positive half-cycles of an applied signal, therefore, the driver transistor 34 operates as a common emitter amplifier. The output transistor 8, which is driven into conduction on this half-cycle of the applied signal, operates as a common collector amplifier.

On negative half-cycles of an applied input signal the driver transistor 34 will conduct less heavily. Thus, the voltage on the emitter 36 will become more negative and the voltage on the collector 38 will become less negative. The emitter 36 of the driver transistor 34 is coupled through the coupling capacitor 62 to the base 24 of the output transistor 18. The output transistor 18, which is biased class B, conducts and provides signal current flow through the voice coil 28 of the loudspeaker 26. On negative half-cycles of an applied signal, therefore, the driver transistor 34 operates as a common collector amplifier. The output transistor 18, which is driven into conduction on this half-cycle of the applied signal, operates, on the other hand, as a common emitter amplifier. Hence, on one half-cycle of the applied signal a common emitter transistor amplifier drives a common collector transistor amplifier and on the other half-cycle of the applied signal a common collector transistor amplifier drives a common emitter transistor amplifier. For this reason, the overall circuit gain on both halves of the signal cycle is approximately the same and circuit balance is maintained.

As was mentioned hereinbefore, the diode 60, which is connected, in accordance with the invention, with the base 24 of the output transistor 18 serves several important functions. The principal function of the diode 60 is to prevent the coupling capacitor 62 from charging in a direction which would tend to reverse bias the transistor 18 and cause distortion. The diode 60 conducts and provides a low impedance discharge path. The capacitor 62 discharges through this path and the resistor 58 to ground preventing the undesired distortion.

The input impedance of the driver transistor 34 may be different during each half cycle of an applied signal. The input impedance may rise during positive half-cycles, thus decreasing the gain. By including the diode 60 in the circuit, however, it conducts on positive half-cycles of an applied signal and shunts the resistor 52 with the series impedance of the diode 60 and the resistor 58. The polarity of the signal voltage across the resistor 58 is such that the voltage is most negative during the positive half-cycles of the applied signal. This signal is coupled through the capacitor 62 to the emitter 36 of the driver transistor 34. Current is, therefore, drawn from the emitter 36. If the current so drawn is equal to the dynamic emitter current of the driver transistor 34, the total effect will be that of grounding the emitter of the driver transistor 34 during positive half-cycles and the driver transistor input impedance will be decreased during the positive half-cycles.

Since the diode 60 diverts driver emitter current during the positive half-cycles of the applied signal, a larger signal voltage is provided across the voice coil 28 for a given supply voltage. This results because the flow of dynamic emitter current through the resistor 52 would cause part of the available supply voltage to be absorbed by the additional voltage drop across the resistor 52. Thus the voltage swing of the transistor 8 and across the voice coil 28 would be restricted. This undesired effect is prevented by diverting the driver emitter current through the diode 60.

While it will be understood that the circuit specification may vary according to the design for any particular application, the following circuit specifications are included by way of example only. It is to be understood that these circuit specifications are also appropriate for use with P conductivity type output transistors and an N conductivity type driver transistor, such as N-P-N and P-N-P junction transistors, respectively, providing the polarities of the supply voltages are reversed.

| | |
|---|---|
| Capacitors 29, 44, and 62 | 1000, 50 and 200 microfarads, respectively. |
| Resistors 46; 48; 50; 52; 54; 56; and 58 | 1,800; 10,000; 10,000; 82; 120; 100; and 15 ohms, respectively. |
| Voice coil 28 | 4 ohms. |
| Batteries 30 and 32 | 4.5 and 1.5 volts, respectively. |

A push-pull amplifier circuit utilizing transistors of the same conductivity type is conveniently and efficiently driven, in accordance with the invention, by a driver transistor of an opposite conductivity type. By such a circuit, the advantages of push-pull operation are achieved while maintaining circuit balance. No coupling transformers are needed, making the circuit relatively inexpensive and commercially attractive.

What is claimed is:

1. A signal amplifier circuit comprising, in combination, a class B push-pull output stage comprising a pair of transistors of the same conductivity type each including base, emitter, and collector electrodes, means connecting the emitter and collector electrodes of said transistors in series for direct-current, means providing an output circuit connected with the collector electrode of one of said pair of transistors and with the emitter electrode of the other of said pair of transistors, a class A driver stage comprising a third transistor of an opposite conductivity type to said pair of transistors and including base, emitter, and collector electrodes, signal input circuit means connected for applying an input signal to the base electrode of said third transistor, means connecting the collector of said third transistor with the base electrode of said other of said pair of transistors, signal conveying means including a capacitor connecting the emitter electrode of said third transistor with the base electrode of said one of said pair of transistors, and means including a unilaterally conducting device connecting the collector electrode of said third transistor with the base electrode of said one of said pair of transistors for preventing the charging of said capacitor by signal currents, said third transistor being operative on one half cycle of said applied input signal as a common collector signal amplifier to drive said one of said pair of transistors and as a common emitter signal amplifier on alternate half cycles of an applied input signal to drive the other of said pair of transistors to provide a push-pull output signal across said output circuit.

2. A signal amplifier circuit comprising, in combination, a class B push-pull output stage comprising a pair of transistors of the same conductivity type each including base, emitter, and collector electrodes, means connecting the emitter and collector electrodes of said transistors in series for direct-current, means providing an output circuit connected with the collector electrode of one of said pair of transistors and with the emitter electrode of the other of said pair of transistors, a class A driver stage comprising a third transistor of an opposite conductivity type to said pair of transistors and including base, emitter, and collector electrodes, signal input circuit means connected for applying an input signal between the base electrode of said third transistor and a point of reference potential in said amplifier circuit, means including a capacitor connecting the emitter electrode of said third transistor with the base electrode of said one of said pair of transistors, direct-current conductive low impedance means connecting the collector electrode of said third transistor with said point of reference potential, and means providing a signal conveying path between the collector electrode of said third transistor and the base electrode of the other of said pair of transistors and a discharge path for said coupling capacitor on alternate half cycles of said applied input signal including a diode connected between the base electrode of said one of said transistors and an intermediate point of said low impedance means, said third transistor being operative on one half cycle of said applied input signal as a common collector signal amplifier to drive said one of said pair of transistors and as a common emitter signal amplifier on alternate half cycles of an applied input signal to drive the other of said pair of transistors to provide a push-pull output signal across said output circuit.

3. An audio frequency signal amplifier circuit comprising, in combination, a class B push-pull output stage comprising a first and a second transistor of the same conductivity type each having base, emitter, and collector electrodes, means connecting the emitter of said first transistor to a point of reference potential in said amplifier circuit, means directly connecting the collector of said first transistor with the emitter of said second transistor, means providing a first direct-current supply source having a pair of terminals, means connecting the collector of said second transistor with one terminal of said supply source, means providing a second direct-current supply source having a pair of terminals, means connecting one of the terminals of said second supply source with said point of reference potential, an output load impedance element having a pair of terminals one of which is connected with the other terminals of said first and second supply source, means including a capacitor connecting the other terminal of said output load impedance element with the collector of said first transistor and the emitter of said second transistor, a class A driver stage including a third transistor of an opposite conductivity type to said first and second transistors and including base, emitter, and collector electrodes, direct-current conductive impedance means connecting the base electrode of said third transistor with said point of reference potential and with said one terminal of said first supply source to provide said base electrode with a substantially fixed bias potential, signal input circuit means connected with the base electrode of said third transistor for applying a signal between the base electrode of said third transistor and said point of reference potential, direct-current conductive impedance means connecting the emitter electrode of said third transistor with said one terminal of said first supply source, low impedance means connecting the collector of said third transistor with said point of reference potential, first direct-current conductive means connected between the collector electrode of said third transistor and the base electrode of said second transistor, second direct-current conductive means connecting a first intermediate point of said low impedance means to the junction of said capacitor and said load impedance element, means including a diode connecting a second intermediate point of said low impedance means with the base electrode of said first transistor, and a coupling capacitor connected between the emitter electrode of said third transistor and the junction of said diode and the base electrode of said first transistor.

References Cited in the file of this patent

UNITED STATES PATENTS

| | | |
|---|---|---|
| 2,659,775 | Coulter | Nov. 17, 1953 |
| 2,762,874 | Barco | Sept. 11, 1956 |
| 2,777,020 | Dobosy | Jan. 8, 1957 |
| 2,783,314 | Reaves | Feb. 26, 1957 |
| 2,784,262 | Crow | Mar. 5, 1957 |

OTHER REFERENCES

Sziklai: "Symmetrical Properties, etc.," Proceedings of the IRE, June 1953, page 718.

Sziklai: "Transistor . . . Applications," Electronic Engineering, page 363, September 1953.

Richards: "Power Transistors, etc," published by Clevite Corp., March 1954, pages 1–5.